United States Patent
Vijayan et al.

(10) Patent No.: US 11,380,148 B2
(45) Date of Patent: *Jul. 5, 2022

(54) 3D VEHICLE MODEL DATA CAPTURING AND RETRIEVING FOR VEHICLE INSPECTION, SERVICE AND MAINTENANCE

(71) Applicant: Tekion Corp, San Ramon, CA (US)

(72) Inventors: Jayaprakash Vijayan, Dublin, CA (US); Gurusankar Sankararaman, Dublin, CA (US); Anand Ramakotti, Dublin, CA (US); Sigmundo Bautista, Alameda, CA (US); Justin Alexander Chi-Young Hou, Pleasanton, CA (US)

(73) Assignee: Tekion Corp, Pleasanton, CA (US)

( * ) Notice: Subject to any disclaimer, the term of this patent is extended or adjusted under 35 U.S.C. 154(b) by 128 days.

This patent is subject to a terminal disclaimer.

(21) Appl. No.: 17/011,653

(22) Filed: Sep. 3, 2020

(65) Prior Publication Data
US 2020/0402327 A1 Dec. 24, 2020

Related U.S. Application Data

(63) Continuation of application No. 15/791,664, filed on Oct. 24, 2017, now Pat. No. 10,909,779, which is a
(Continued)

(51) Int. Cl.
*G07C 5/08* (2006.01)
*G06T 7/00* (2017.01)
(Continued)

(52) U.S. Cl.
CPC ....... *G07C 5/0808* (2013.01); *G06F 3/04842* (2013.01); *G06F 30/15* (2020.01);
(Continued)

(58) Field of Classification Search
CPC ... G07C 5/0808; G07C 5/085; G06F 3/04842; G06F 30/15; G06F 3/04817;
(Continued)

(56) References Cited

U.S. PATENT DOCUMENTS

| | | | |
|---|---|---|---|
| 8,443,301 B1 * | 5/2013 | Easterly | G07C 5/006 715/848 |
| 10,142,430 B1 | 11/2018 | Onnen et al. | |

(Continued)

FOREIGN PATENT DOCUMENTS

| | | |
|---|---|---|
| CN | 1877634 A | 12/2006 |
| CN | 103620590 A | 3/2014 |

(Continued)

OTHER PUBLICATIONS

United States Office Action, U.S. Appl. No. 15/721,569, dated Nov. 25, 2020, 47 pages.
(Continued)

*Primary Examiner* — Peter D Nolan
*Assistant Examiner* — Ana D Thomas
(74) *Attorney, Agent, or Firm* — Fenwick & West LLP

(57) ABSTRACT

In one aspect, a computerized method useful for three-dimensional (3D) model data rendering and information capturing during a vehicle inspection check-in process for service comprising includes the step of providing a vehicle for a check-in inspection. The computerized method includes the step of obtaining a vehicle identification number (VIN) of the vehicle. The computerized method includes the step of, based on the VIN of the vehicle, obtaining a 3D vehicle model data. The 3D vehicle model data matches a type of the vehicle. The 3D vehicle model data is generated from a manufacturer's three-dimensional (3D) computer-aided design (CAD) model data of the type of the vehicle.

20 Claims, 13 Drawing Sheets

Related U.S. Application Data continuation-in-part of application No. 15/721,569, filed on Sep. 29, 2017, now abandoned, which is a continuation-in-part of application No. 15/687,112, filed on Aug. 25, 2017, now Pat. No. 10,375,544, which is a continuation-in-part of application No. 15/669,956, filed on Aug. 6, 2017, now abandoned.

(60) Provisional application No. 62/373,348, filed on Aug. 11, 2016.

(51) Int. Cl.
| | | |
|---|---|---|
| *G06T 19/00* | (2011.01) | |
| *G06F 3/04842* | (2022.01) | |
| *G06F 30/15* | (2020.01) | |
| *G06F 3/04817* | (2022.01) | |
| *G06F 3/04883* | (2022.01) | |
| *G06F 3/0482* | (2013.01) | |

(52) U.S. Cl.
CPC ............ *G06T 7/0004* (2013.01); *G06T 19/00* (2013.01); *G07C 5/085* (2013.01); *G06F 3/0482* (2013.01); *G06F 3/04817* (2013.01); *G06F 3/04883* (2013.01); *G06F 2203/04808* (2013.01); *G06T 2200/24* (2013.01); *G06T 2207/30248* (2013.01); *G06T 2219/004* (2013.01); *Y02D 30/70* (2020.08)

(58) Field of Classification Search
CPC ............ G06F 3/0482; G06F 3/04883; G06F 2203/04808; G06T 7/0004; G06T 19/00; G06T 2200/24; G06T 2207/30248; G06T 2219/004; Y02D 30/70
See application file for complete search history.

(56) References Cited

U.S. PATENT DOCUMENTS

| | | | |
|---|---|---|---|
| 10,497,108 B1 * | 12/2019 | Knuffman | G06Q 10/1097 |
| 2002/0103582 A1 | 8/2002 | Ohmura et al. | |
| 2004/0093268 A1 | 5/2004 | Ramchandani et al. | |
| 2006/0111955 A1 | 5/2006 | Winter et al. | |
| 2007/0064914 A1 | 3/2007 | Seyer et al. | |
| 2012/0030726 A1 * | 2/2012 | Winter | G06Q 30/0251 725/114 |
| 2012/0123951 A1 | 5/2012 | Hyatt et al. | |
| 2014/0229316 A1 | 8/2014 | Brandon | |
| 2016/0307185 A1 | 10/2016 | Betancourt | |
| 2016/0323754 A1 | 11/2016 | Friday et al. | |
| 2017/0164159 A1 | 6/2017 | Mycek et al. | |
| 2017/0352104 A1 | 12/2017 | Hanson et al. | |
| 2018/0203662 A1 | 7/2018 | Liu | |

FOREIGN PATENT DOCUMENTS

| | | |
|---|---|---|
| CN | 105469265 A | 4/2016 |
| WO | WO 2005/076828 A2 | 8/2005 |

OTHER PUBLICATIONS

United States Office Action, U.S. Appl. No. 15/791,664, dated Dec. 31, 2019, 18 pages.

United States Office Action, U.S. Appl. No. 15/721,569, dated May 26, 2021, 52 pages.

Zaheeruddin et al., "Integrating the Supply Chain with RFID: A Technical and Business Analysis," Mar. 26, 2005, Communications of the Association for Information Systems, vol. 15, Article 24, pp. 393-427.

* cited by examiner

1200

3D VEHICLE MODEL DATA CAPTURING AND RETRIEVING FOR VEHICLE INSPECTION, SERVICE AND MAINTENANCE

This application is a continuation of U.S. Ser. No. 15/791,664 filed on Oct. 24, 2017 which is a continuation-in-part of U.S. patent application Ser. No. 15/721,569 filed on Sep. 29, 2017, and is a continuation-in-part of U.S. patent application Ser. No. 15/687,112 filed on Aug. 25, 2017. U.S. patent application Ser. No. 15/687,112 is a continuation-in-part of U.S. patent application Ser. No. 15/669,956 filed on Aug. 6, 2017 which claims the benefit of U.S. Provisional Patent Application No. 62/373,348 filed Aug. 11, 2016. Each of the aforementioned patent applications are incorporated by reference in its entirety.

BACKGROUND

1. Field

This application relates to computer-graphics model augmentation and more specifically to a system, article of manufacture and method for three-dimensional (3D) vehicle model data capturing and retrieving for vehicle inspection, service and maintenances.

2. Related Art

A customer can bring a vehicle to an automobile service provider for service. A service consultant may wish to obtain information about the vehicle. Currently, vehicle inspection applications use a 2D digital or paper representation of a vehicle. This primarily involves marking the location and type of damage. In a 2D model, it may be difficult to identify and associate the damage with its location. Accordingly, it can then be difficult to generate meaningful analytics from the 2D model data. For paper-based models, data may poorly classified (e.g. the type of damage such as a scratch/stain) and clear groupings may not be captured/preserved. This may require the intermediate user of other forms of technology (e.g. optical character recognition (OCR) and/or templated-based image processing from scanning, etc.) in order to provide data. These intermediate steps may be prone to error. Although these are addressed in 2D models, the information is presented in a way that is less user friendly than a 3D rendering as there may be some interpretation required for the user to take the actual car and map it to a 2D flattened model.

BRIEF SUMMARY OF THE INVENTION

In one aspect, a computerized method useful for three-dimensional (3D) model data rendering and information capturing during a vehicle inspection check-in process for service includes the step of providing a vehicle for a check-in inspection. The computerized method includes the step of obtaining a vehicle identification number (VIN) of the vehicle. The computerized method includes the step of, based on the VIN of the vehicle, obtaining a 3D vehicle model data. The 3D vehicle model data matches a type of the vehicle. The 3D vehicle model data is generated from a manufacturer's three-dimensional (3D) computer-aided design (CAD) model data of the type of the vehicle (or other non-OEM 3D models available). The computerized method includes the step of, with the 3D vehicle model data, rendering a 3D vehicle model of the type of the vehicle for display on a service provider's mobile device. The computerized method includes the step of displaying the 3D vehicle model on the service provider's mobile device. The display of the 3D vehicle model receives user gestures indicating a specific type of damage and a location of the damage on the 3D vehicle model. The computerized method includes the step of tagging a location of the damage on the 3D vehicle model with the specific type of damage via a set of selected input icons into the display the 3D vehicle model. The computerized method includes the step of generating a rich data set. The rich data set comprises the location of the damage on the 3D vehicle model and the specific type of damage.

Figure 1:
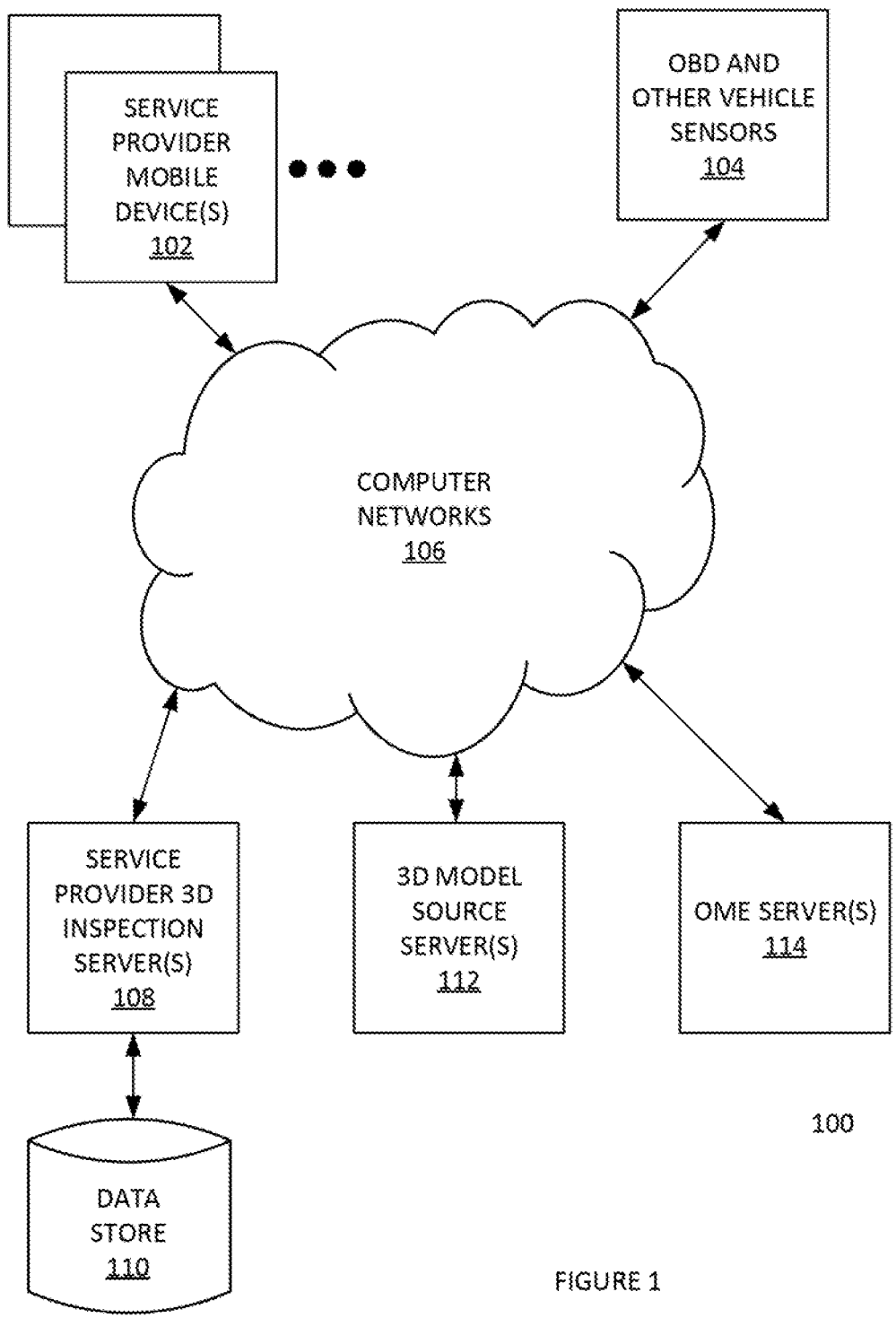
FIG. 1 illustrates an example system for 3D vehicle-model data capturing and retrieving for vehicle inspection, service and maintenance, according to some embodiments.

The Figures described above are a representative set, and are not an exhaustive with respect to embodying the invention.

DESCRIPTION

Disclosed are a system, method, and article of manufacture three-dimensional model data capturing and retrieving for vehicle inspection, service and maintenances. The following description is presented to enable a person of ordinary skill in the art to make and use the various embodiments. Descriptions of specific devices, techniques, and applications are provided only as examples. Various modifications to the examples described herein can be readily apparent to those of ordinary skill in the art, and the general principles defined herein may be applied to other examples and applications without departing from the spirit and scope of the various embodiments.

Reference throughout this specification to 'one embodiment,' an embodiment,' one example,' or similar language means that a particular feature, structure, or characteristic described in connection with the embodiment is Included in at least one embodiment of the present invention. Thus, appearances of the phrases 'in one embodiment,' in an embodiment,' and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams Included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, and they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Example Definitions

Application can be a computer program designed to perform a group of coordinated functions, tasks and/or activities for the benefit of the user.

BLUETOOTH® Low Energy (BLE) can be a wireless personal area network technology. BLE can increase in data broadcasting capacity of a device by increasing the advertising data length of low energy BLUETOOTH® transmissions.

Low-Power Wide-Area Network (LPWAN) and/or Low-Power Network (LPN) is a type of wireless telecommunication wide area network designed to allow long range communications at a low bit rate among things (connected objects), such as sensors operated on a battery. The low power, low bit rate and intended use distinguish this type of network from a wireless WAN that is designed to connect users or businesses, and carry more data, using more power. LoRa can be a chirp spread spectrum (CSS) radio modulation technology for LPWAN. It is noted that various other LPWAN networks can be utilized in various embodiments in lieu of a LoRa network and/or system.

Multi-touch is technology that enables a surface (e.g. a trackpad or touchscreen) to recognize the presence of more than one or more than two points of contact with the surface.

On-board diagnostics (OBD) can be a system that leverages a vehicle's self-diagnostic and reporting capability, OBD systems provide the vehicle owner repair technician and the like, access to the status of the various vehicle subsystems.

Three-dimensional representation (3D) can include 30 computer graphics, 30 computer graphics can use. a three-dimensional representation of geometric data and render it on a user interface, 3D rendering can be the 3D computer graphics process of automatically converting 30 wire frame models into two-dimensional representation (2D) images with 3D photorealistic effects or non-photorealistic rendering on a computer.

Vehicle identification number (VIN) is a unique code, including a serial number, used by the automotive industry to identify individual motor vehicles.

Exemplary Computer Architecture and Systems

A 3D vehicle model can be a 3D rendering of a vehicle used for various vehicle inspection, service and maintenance work flows. A rendering of the 3D vehicle model can include various information about the vehicle. For example, the 3D vehicle model can include, inter alia: general vehicle information, vehicle year, vehicle make/model, vehicle VIN-specific information, trim information, etc. The 3D vehicle model can be displayed on a user interface (e.g. a mobile-device touch screen, a laptop touch screen, etc.) using a vehicle check-in application.

The 3D vehicle model can be interacted with by a user. Touchscreen gestures (e.g. multitouch, gesture-enhanced single-touch, single touch, stylus input patterns, virtual buttons, virtual keypad input, etc.) can enable predefined motions to interact with a computing device and software. Various] 3D rendering visual inspection functions can be triggered by specified multi-touch gestures. For example, a user (e.g. a service consultant) can provide gesture/touch input to spin the 3D rendering of the vehicle model. The user can provide gesture/touch input to zoom in on a display of the 3D rendering of the vehicle (e.g. a pinching gesture can cause the 3D rendering of the vehicle to zoom). The user can provide gesture/touch input to rotate and/or zoom in/zoom out on a display of the 3D rendering of the vehicle model. The user can provide gesture/touch input to add or remove annotations on the 3D rendering of the vehicle. The user can click on annotations/tags to perform various secondary actions such as, inter alia: modify annotations/tags, select type of damage to a tagged area of the vehicle, order replace parts associated with the annotations/tags, obtain an estimate of the cost of repair and parts to repair damage associated with the annotation/tag, etc. By annotating the 3D vehicle model rendered on the service provider's mobile device, the user can capture various inspection, service or maintenance information as an actionable rich data set This information can be retrieved at any point of time during a vehicle inspection, service or maintenance process.

FIG. 1 illustrates an example system 100 for 3D vehicle model data capturing and retrieving for inspection, service and maintenance, according to some embodiments. System 100 can include various computer and/or cellular data networks 100. Networks 106 can include the Internet, local area networks (LAN) 104, enterprise wide networks, text messaging networks (e.g. short messaging service (SMS) networks, multimedia messaging service (MMS) networks, proprietary messaging networks, instant messaging service networks, email systems, etc. Networks 106 can be used to communicate messages and/or other information from the various entities of system 100. Networks can include LPWAN, BLE and/or various local area networks.

In one example embodiment, system 100 can include service provider mobile device(s) 102. Service provider mobile device(s) 102 can be a smart phone, tablet computer, etc. Service provider mobile device(s) 102 can include a vehicle service provider application that implements the service-provider functions of the processes provided herein (e.g. a 30 vehicle-modelling application, etc.). Vehicle service provider application can be used to obtain vehicle information via user input, OBD 104 input, other vehicle sensor(s) input, etc. Vehicle service provider application can display a 3D vehicle model that is related to a customer's vehicle. Vehicle service provider application can enable users to tag various vehicle state information (e.g. repair information, damage information, vehicle parts information, etc.) onto a display of the 3D vehicle model. The 3D vehicle model of the customer's vehicle can be a 3D rendering/model that can be interacted with by a user (e.g. via touchscreen gestures, text input, etc.). In this way, rich data generated herein can be tagged to annotate information on the 3D vehicle model for inspection and damage. The rich data can be rendered from manufacturing computer-aided design (CAD) designs to produce replicas of the model for service and maintenance experience. The 3D vehicle model can be displayed as an image with 3D effects.

Figure 8:
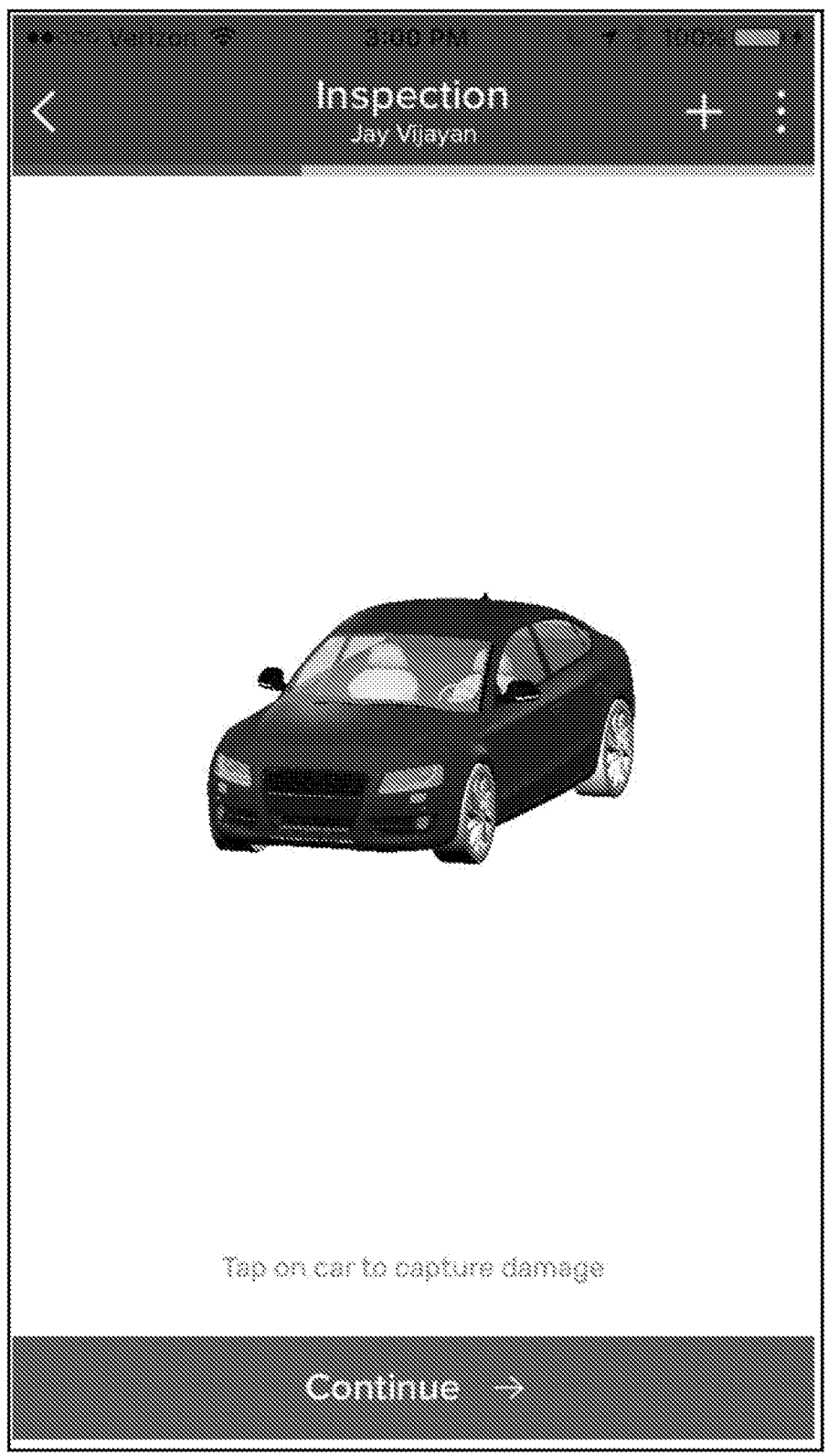
Figure 9:
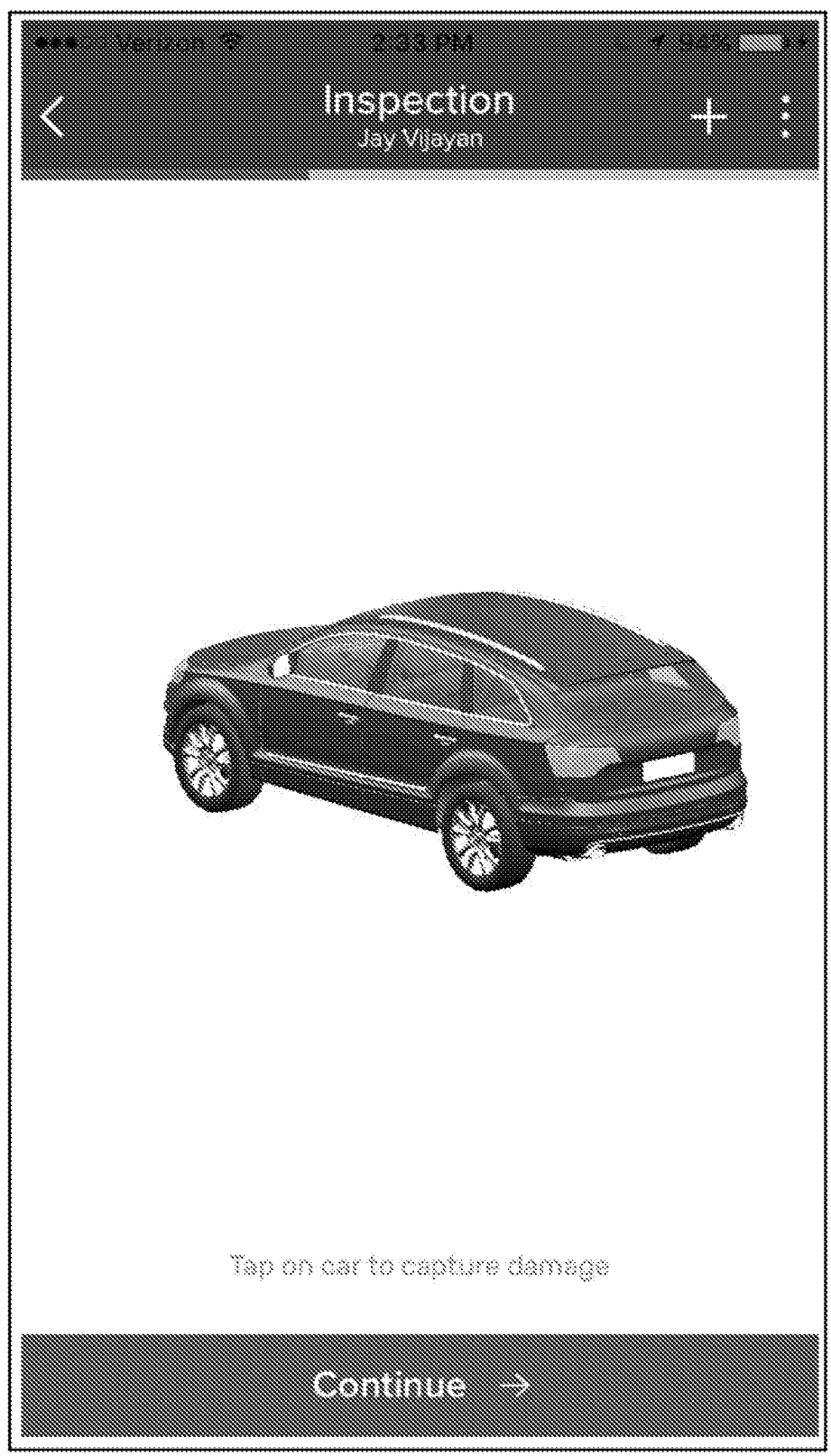

The rich data can be actionable and used to implement various inspection, service and/or maintenance operations. In some examples, rich data can include, inter alia: a damage type, damage location, digital images of the damaged area, and other relevant data. Rich data can also include digital video data, microphone recording data, other detected sensor data, service consultant or customer input data, etc. Depending on the fidelity of the 3D vehicle model, rich data can be associated with a general 3D vehicle model of the vehicle and/or a specific location, system or part of a vehicle. FIGS. 8-9 infra, provide examples of obtaining rich data with a 3D vehicle-modelling application on a service provider's mobile device.

Various functionalities can be offloaded to service provider 3D inspection server(s) 108. Service provider 3D inspection server(s) 108 can implement, inter alia: gesture recognition; 3D rendering; database management; calf third party servers for vehicle type data/parts ordering/manufacturer notification; annotation actions (via data tags, etc.); etc. Service provider 3D inspection server(s) 108 can be implemented in a cloud-computing platform and/or on an on-premises server. Service provider 3D inspection server(s) 108 can obtain 3D vehicle models of a vehicle type from 3D vehicle model source server(s) 112. Data obtained by system 100 can be communicated to various other entities such as, inter alia: OME servers 114, vehicle manufacturers, analytics entities, etc. Data can be stored in data store 110.

Figure 2:
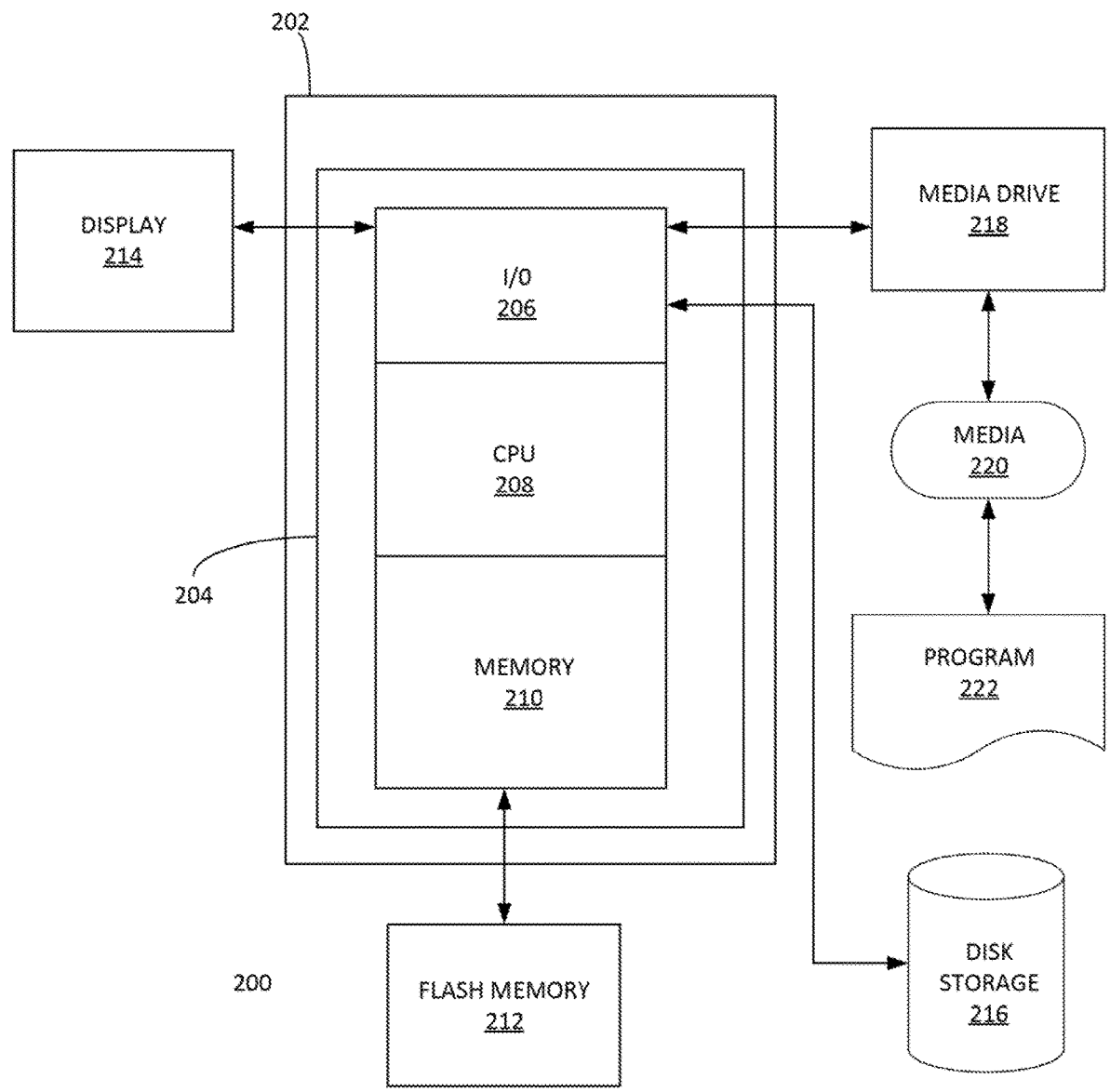
FIG. 2 depicts an exemplary computing system that can be configured to perform any one of the processes provided herein.

FIG. 2 depicts an exemplary computing system 200 that can be configured to perform any one of the processes provided herein. In this context, computing system 200 may include, for example, a processor, memory, storage, and I/O devices (e.g., monitor, keyboard, disk drive, Internet connection, etc.). However, computing system 200 may include circuitry or other specialized hardware for carrying out some or all aspects of the processes. In some operational settings, computing system 200 may be configured as a system that includes one or more units, each of which is configured to carry out some aspects of the processes either in software, hardware, or some combination thereof.

FIG. 2 depicts computing system 200 with a number of components that may be used to perform any of the processes described herein. The main system 202 includes a motherboard 204 having an I/O section 206, one or more central processing units (CPU) 208, and a memory section 210, which may have a flash memory card 212 related to it. The I/O section 206 can be connected to a display 214, a keyboard and/or other user input (not shown), a disk storage unit 216, and a media drive unit 218. The media drive unit 218 can read/write a computer-readable medium 220, which can contain programs 222 and/or data. Computing system 200 can include a web browser. Moreover, it is noted that computing system 200 can be configured to include additional systems in order to fulfill various functionalities. Computing system 200 can communicate with other computing devices based on various computer communication protocols such a Wi-Fi, Bluetooth® (and/or other standards for exchanging data over short distances includes those using short-wavelength radio transmissions), USB, Ethernet, cellular, an ultrasonic local area communication protocol, etc.

Figure 3:
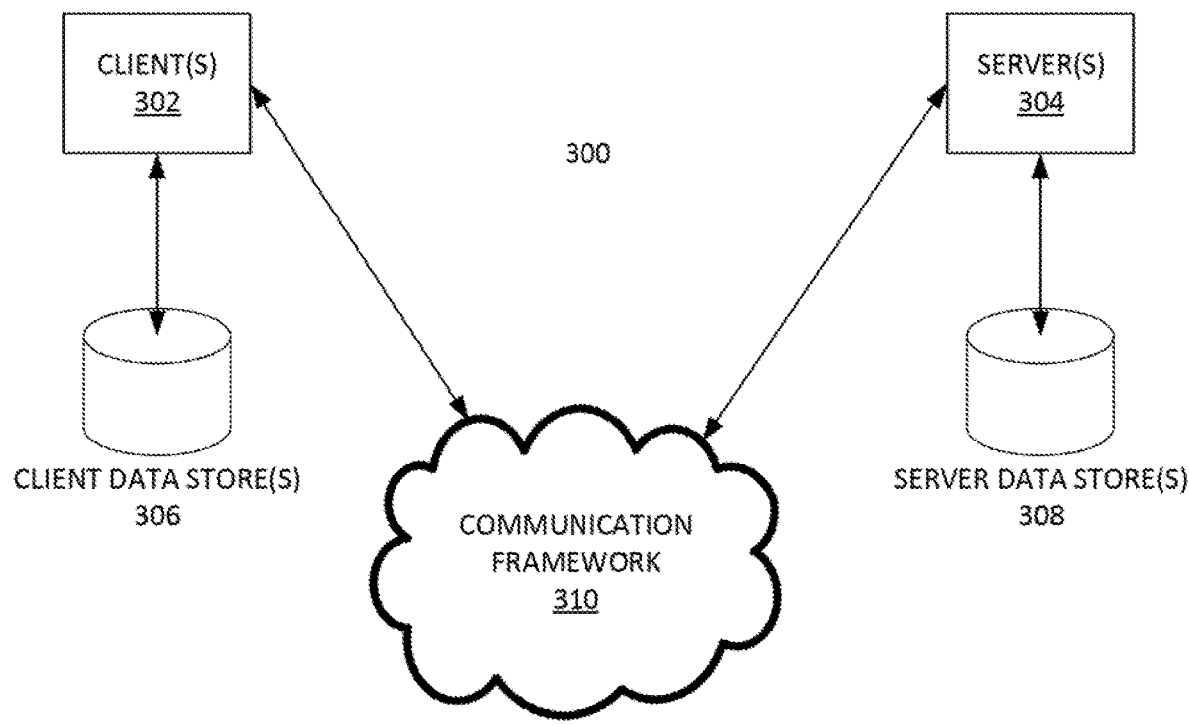
FIG. 3 is a block diagram of a sample-computing environment that can be utilized to implement various embodiments.

FIG. 3 is a block diagram of a sample-computing environment 300 that can be utilized to implement various embodiments. The system 300 further illustrates a system that includes one or more client(s) 302. The client(s) 302 can be hardware and/or software (e.g., threads, processes, computing devices). The system 300 also includes one or more server(s) 304. The server(s) 304 can also be hardware and/or software (e.g., threads, processes, computing devices). One possible communication between a client 302 and a server 304 may be in the form of a data packet adapted to be transmitted between two or more computer processes. The system 300 includes a communication framework 310 that can be employed to facilitate communications between the client(s) 302 and the server(s) 304. The client(s) 302 are connected to one or more client data store(s) 306 that can be employed to store information local to the client(s) 302. Similarly, the server(s) 304 are connected to one or more server data store(s) 308 that can be employed to store information local to the server(s) 304. In some embodiments, system 300 can instead be a collection of remote computing services constituting a cloud-computing platform. It is noted that various functionalities of systems 100-300 can be implemented as virtual systems and/or in a cloud-computing platform, according to some embodiments.

Exemplary Methods

Various methods of 3D vehicle model data capturing and retrieving for vehicle inspection, service and maintenance are provided herein.

Figure 4:
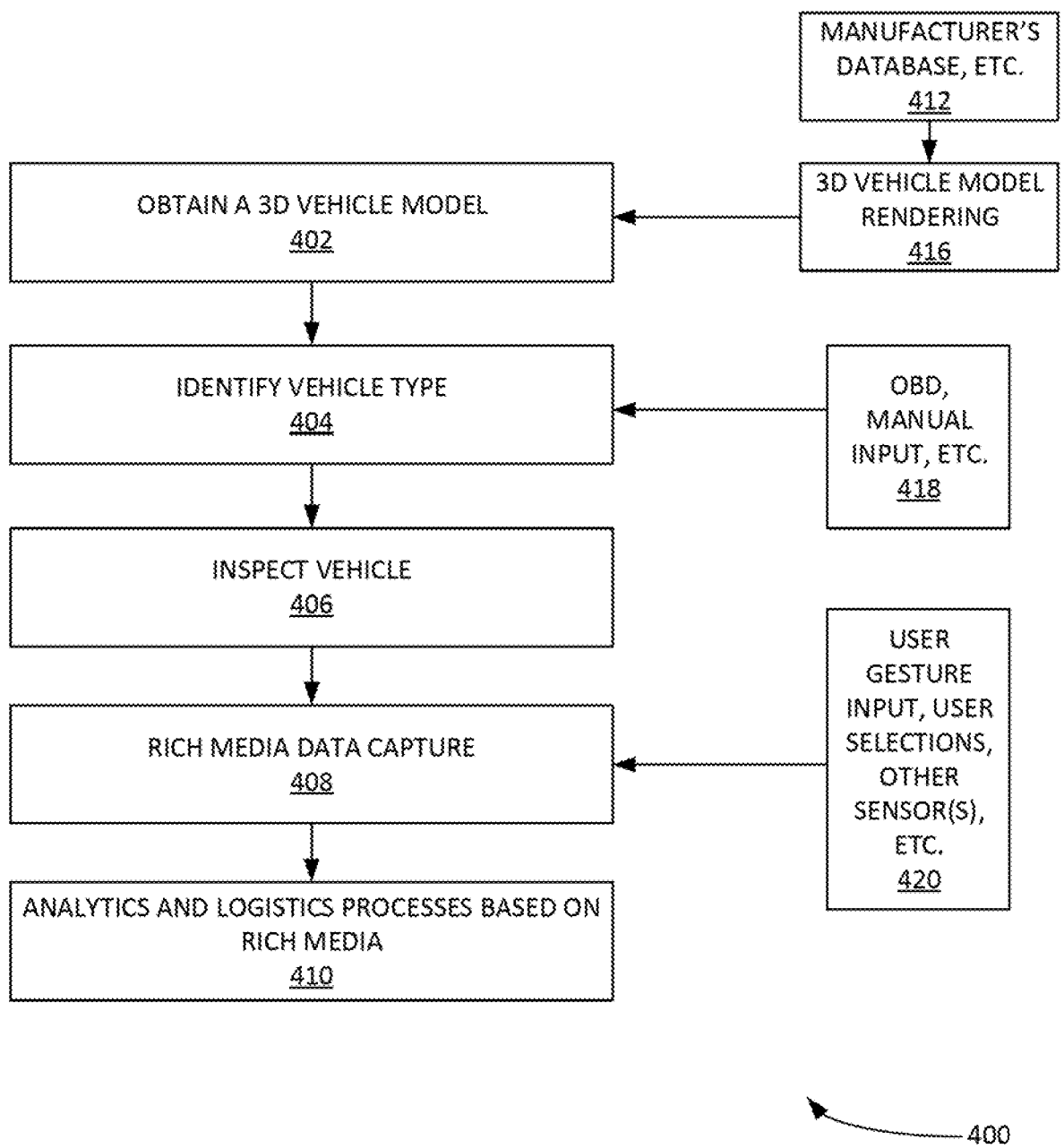
FIG. 4 illustrates an example process for implementing 3 3D vehicle model with rich data, according to some embodiments.

FIG. 4 illustrates an example process 400 for Implementing a 3D vehicle model tagged with rich data/according to some embodiments. The rich data can be vehicle damage data, damage location data, and the like. Users can tag this data to the 3D vehicle model. The tagged 3D vehicle model can be used in later steps of the vehicle check-in process and/or vehicle service process.

In step 402, process 400 can obtain a digital rendering of a 3D vehicle model. For example, in step 412, process 400 can obtain a 3D computer-aided design (CAD) model from the manufacturer's database and/or other OEM information about various vehicle types. Vehicle types can be generalized, such as, sedans, SUVs, trucks, etc. Vehicle types can also include specific versions of vehicles based on more granular information such as, inter alia: make, model, year, trim, etc. in step 416, the 30 CAD model can be used to generate a 30 vehicle model data. This 3D vehicle model data can be stored along with other 3D vehicle models. In this way, in some examples, a 3D vehicle model data for each type of vehicle to be serviced can be pre-generated.

It is noted, that in one alternative embodiment (not shown) for generating and/or augmenting the 3D vehicle model of a vehicle, a digital video of a customer's vehicle can be obtained with a camera system. The camera images and then be used construct a 3D vehicle model.

In step 404, the vehicle's type can be identified. The vehicle type can be identified from the vehicle's VIN number (e.g. using an OBD device and/or manual inspection and input in step 418). Step 404 can then obtain relevant 3D vehicle model data from the database of pre-generated 3D vehicle models.

In step 406, the vehicle can be inspected as part of a vehicle service check-in process. The service provider and/or customer can note/tag the vehicle damage using a service provider's vehicle check-in application.

In step 408, process 400 can use the inspection data (e.g. user multitouch gestures and damage icon selections) and/or other on-premises vehicle sensor data 418 to generate a set of actionable rich data related to the vehicle damage and/or other service-related details. Other on-premises vehicle sensor data can be obtained by various sensors (e.g. OBD devices such as a OBD passthrough dongle, vehicle system sensors, video cameras, microphones, etc. 420).

In step 410, process 400 can implement various analytics and logistics processes based on the captured rich data. For example, the rich data from process 400 can be communicated to an automobile parts manufacturer server for aggregation with other vehicle data (e.g. see process 500, etc.). In another example, process 400 can be utilized to determine the ordering of vehicle parts and/or other repair schedule logistics for the vehicle. In one example, the rich data can be used to automatically order a set of vehicle parts such that the waiting time for the parts is decreased.

Figure 5:
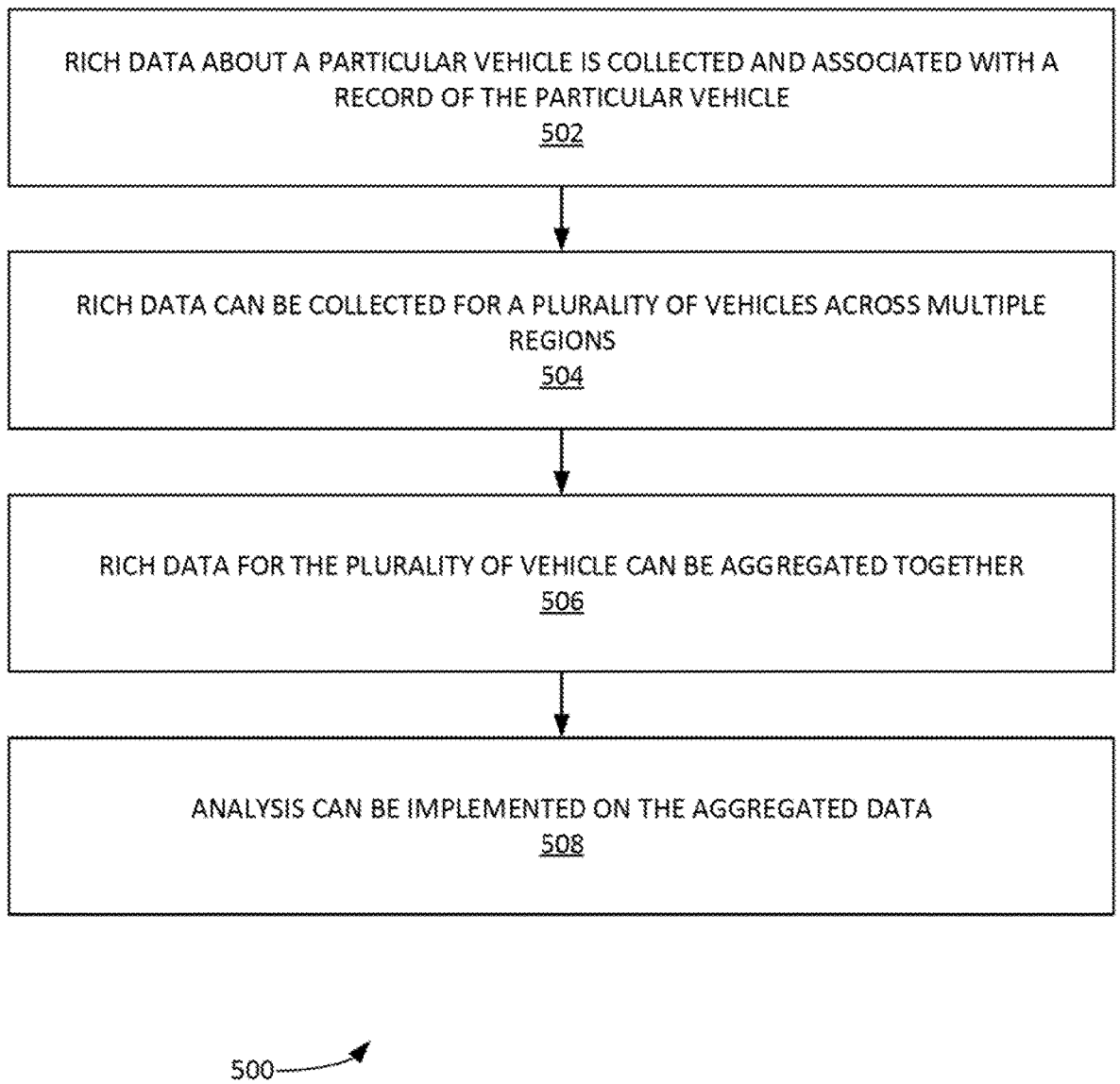
FIG. 5 illustrates an example process of aggregating rich data for a plurality of vehicles for analysis, according to some embodiments.

FIG. 5 illustrates an example process 500 of aggregating rich data for a plurality of vehicles for analysis, according to some embodiments. In step 502, rich data about a particular vehicle is collected and associated with a record of the particular vehicle. In step 504, this rich data can be collected for a plurality of vehicles across multiple regions. In step 506, the rich data for the plurality of vehicle can be aggregated together, in step 508, analysis can be implemented on the aggregated data. This analysis can be done in lieu of various service centers shipping parts or items back to the Original Equipment Manufacturer (OEM) for analysis. Process 500 can enable greater data collection without incurring the cost of shipping items back to the OEM. Process 500 can be used to determine current issues with a specified type of vehicle across multiple perspectives.

Figure 6:
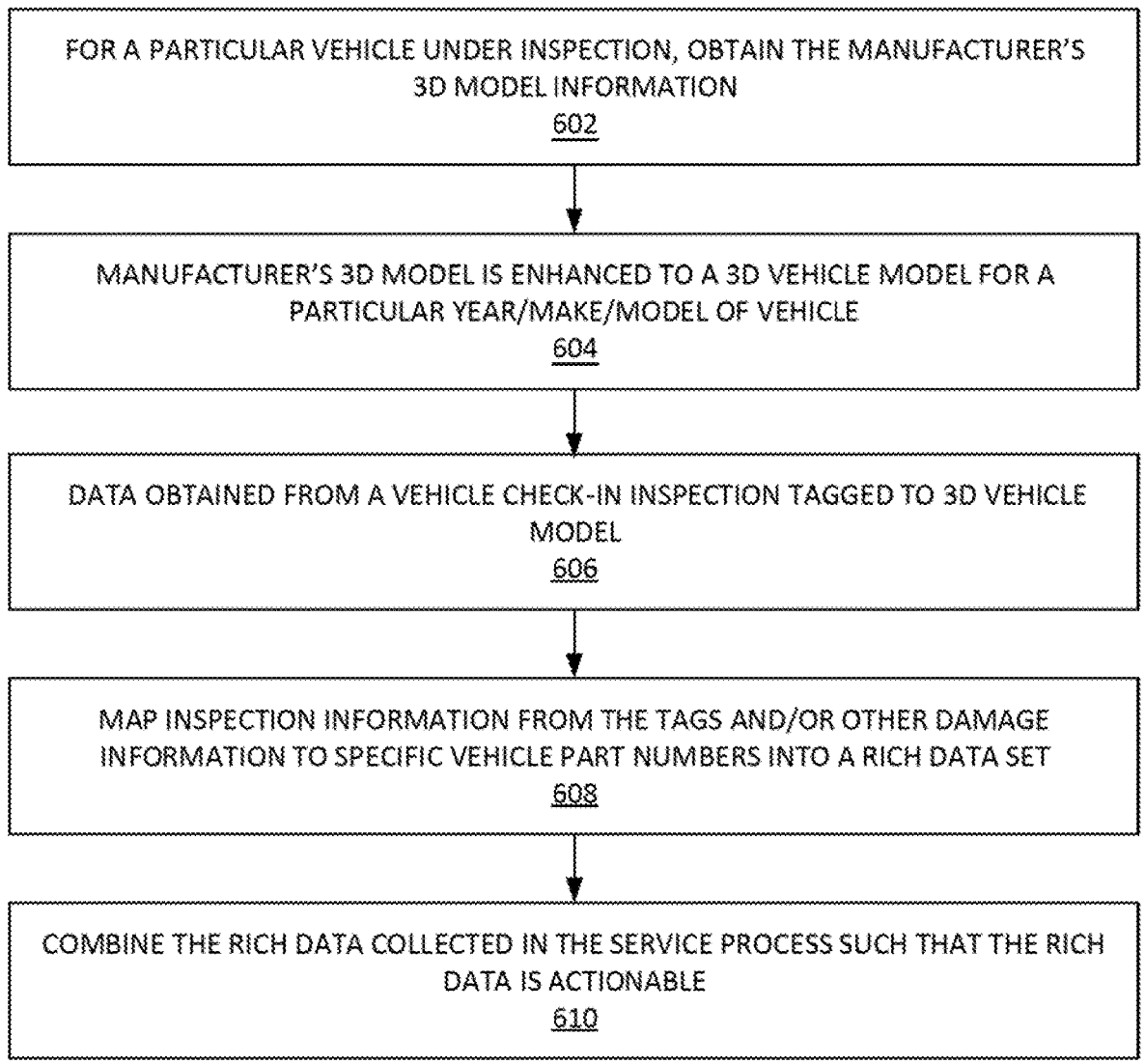
FIG. 6 illustrates an example process for generating actionable rich data from a 3D vehicle model, according to some embodiments.

FIG. 6 illustrates an example process 600 for generating actionable rich data from a 3D vehicle model, according to some embodiments. In step 602, for a particular vehicle under inspection, process 600 can obtain the manufacturer's 3D vehicle model information. The manufacturer's 3D vehicle model information can include manufacturing design information (e.g. vehicle parts and part location, etc.). The manufacturer's 3D vehicle model can be enhanced from a generalized model to a specific 3D vehicle model that can be for a particular vehicle in step 604. The vehicle's VIN data can be used to retrieve the relevant 3D vehicle model and/or other specific data about the vehicle (e.g. the make, model, body type, year, historical data about vehicle, etc.). In step 606, the 3D vehicle model can be tagged with data obtained from a vehicle check-in inspection. This data can be saved as a rich data set. The tagged data can be rendered for view on a display of the user-side computing device. In step 608, process 600 can map the inspection information from the tags and/or other damage information to specific vehicle part numbers. In step 610, process 600 can combine the rich data collected in the service process (e.g. Check-In/Check-Out/Repairs) such that the rich data can be used in the following cases, inter alia:

1) a damaged part can be actionable for sublet or autobody shops to determine inventory stock (e.g. for nearby pick up and/or time for a part order);

2) inspection items (e.g. to check stock in Inventory such that a service consultant can sell the parts and service to the customer and receive their approval while directly talking with the customer rather than waiting until after the customer has left to get approval); and 3) provide OEMs direct access to aggregated reports (e.g. see process 500 supra) that show common trends for said parts. In addition to counting the trend in parts inspection/damage, OEMs can receive the attached rich data that is collected.

Example Application Screen Shots

Figure 7:
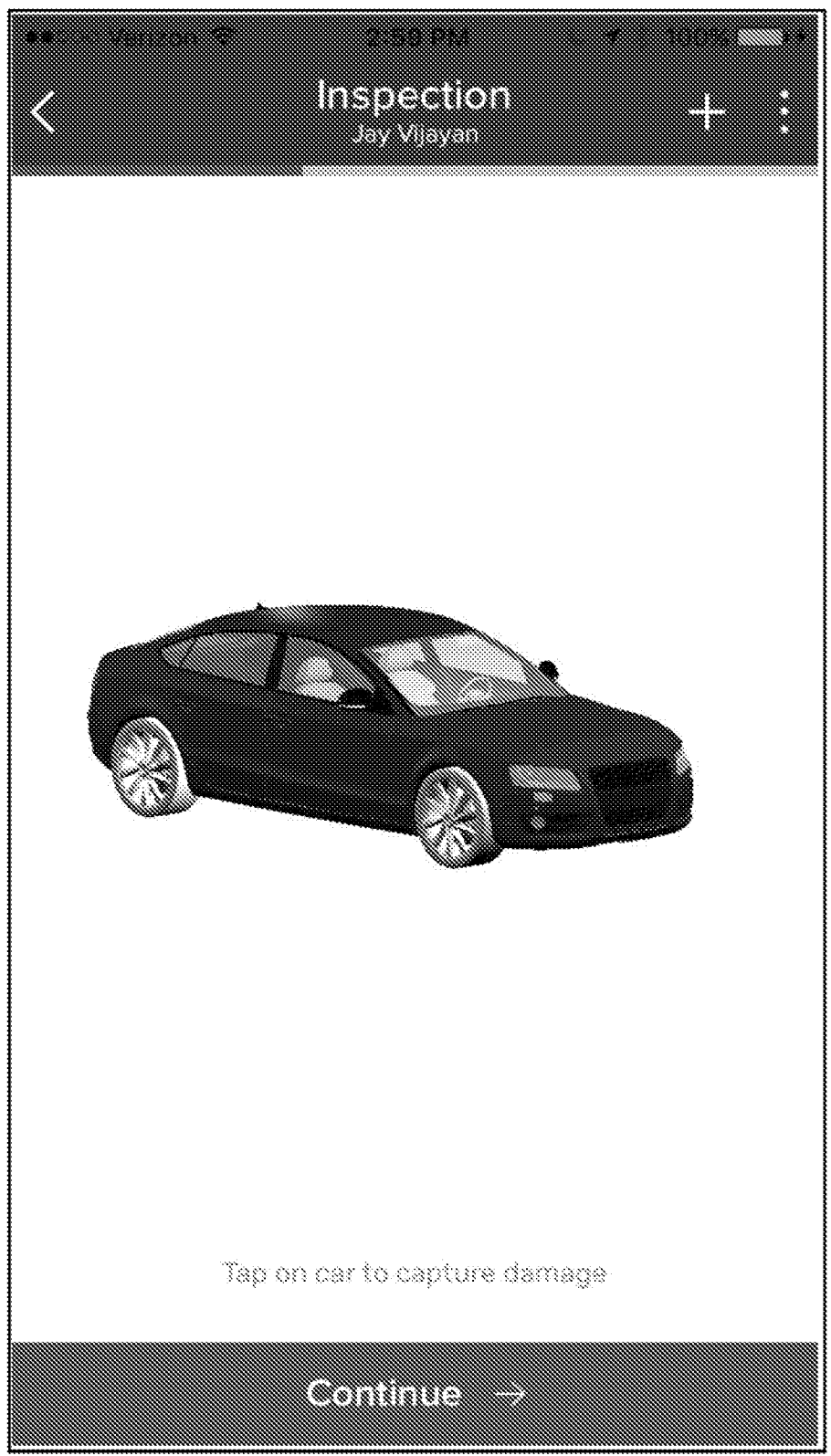
FIG. 7-12 illustrates screen shots that can be used to implement various embodiments herein.

FIG. 7-12 illustrates screen shots that can be used to implement various embodiments of a 3D vehicle-modelling application provided herein. The 3D vehicle-modelling application can be implemented in a mobile device of a service consultant. FIGS. 7-8 illustrate example 3D vehicle models of a sedan type of vehicle. These 3D vehicle models are displayed for tagging by the 3D vehicle-modelling application.

Figure 10:

FIGS. 9-10 illustrate screen shots of a 3D vehicle model of an SUV vehicle. More specifically, FIG. 10 illustrates an initial 3D vehicle model of a vehicle to be processed in a vehicle service provider check-in process. At the beginning of the check-in process, the vehicle can be identified using various methods (e.g. via a VIN, user input, etc.). This identification information can be used to obtain a pre-generated 3D vehicle model that is related to the vehicle. This 3D vehicle model can be rendered for display by the 3D vehicle modelling application. The 3D vehicle vehicle-modelling application can enable tagging of the 3D vehicle model with tags and/or other annotations.

Figure 11:
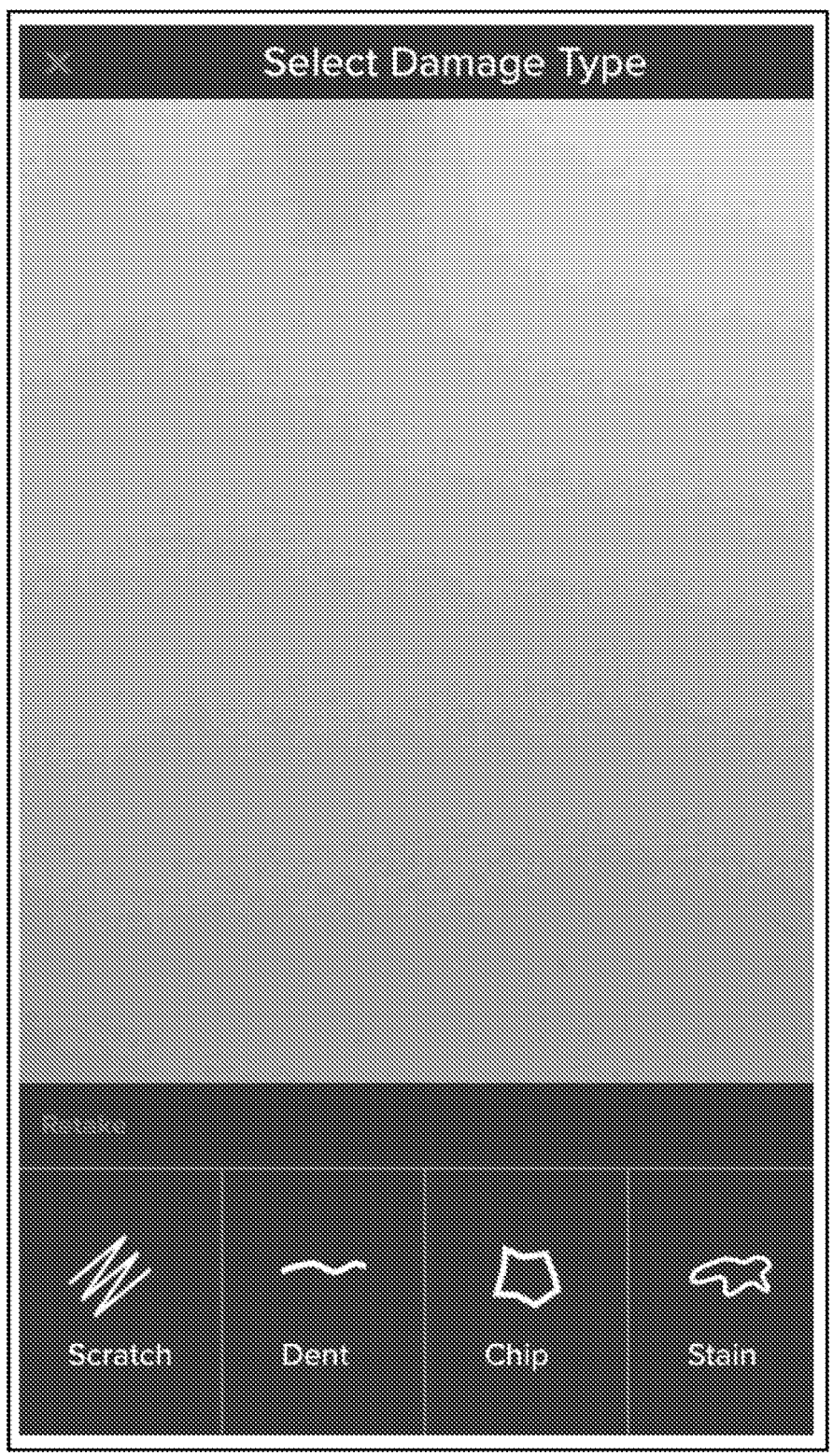

FIG. 11 illustrates an example screen shot of a digital image an area of a vehicle displayed with a 3D vehicle-modelling application. The service consultant can take a digital photo of the area of a vehicle. The service consultant can then use the various virtual buttons in the 3D vehicle-modelling application to tag the relevant part of the 3D vehicle model with the digital image and various icons defining damage type. It is noted that other types of data (e.g. digital videos, OBD data, tire pressure, tread depth, audio recordings of vehicle sounds, etc.) can be captured by the 3D vehicle-modelling application and used to annotate tags as well. Other types of vehicle part damage can also be input via specific types vehicle parts. For example, if a digital image of a tire/wheel is obtained, then 3D vehicle-modelling application can display virtual buttons/icons for indicating tire puncture location, tread depth measurements, air pressure, etc. It is noted that inspection items can be customized by automobile dealers, OEMs, etc. Icon tags for these can be included in the 3D vehicle modelling application. These tags and annotated data can be used to generate an actionable rich data set.

It is noted that interior items can also be inspected using the 3D vehicle modelling application. For example, staining of seats can be marked, photographed and included as tags and tag annotations in an actionable rich data set. The 3D vehicle-modelling application can then use the actionable rich data set to suggest a vehicle detailing service for cleaning of the stain. The price can be displayed. The service consultant can sell this service to the customer and schedule the stain cleaning with the 3D vehicle modelling application.

In another example, the 3D vehicle-modelling application can be used to mark a chipped windshield. A picture of the chipped windshield can be obtained. An icon can be used to mark the 3D vehicle model's windshield as chipped. This information can be stored in an actionable rich data set. A windshield repair can be scheduled with the 3D vehicle modelling application. The customer can be billed accordingly.

Figure 12:
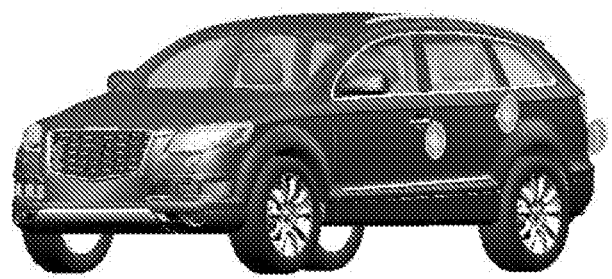

FIG. 12 illustrates an example of a vehicle with tags associated with damaged locations/parts of a vehicle. The tags can be clicked on to access additional information (e.g. tag annotations such as digital images of the damage, etc.) about the damage, in some examples, the annotation can include current (e.g. assuming processing and/or networking latencies and the like) vehicle repair status, customer status, estimate costs, service consultant status, etc.

Other Example Embodiments

Figure 13:
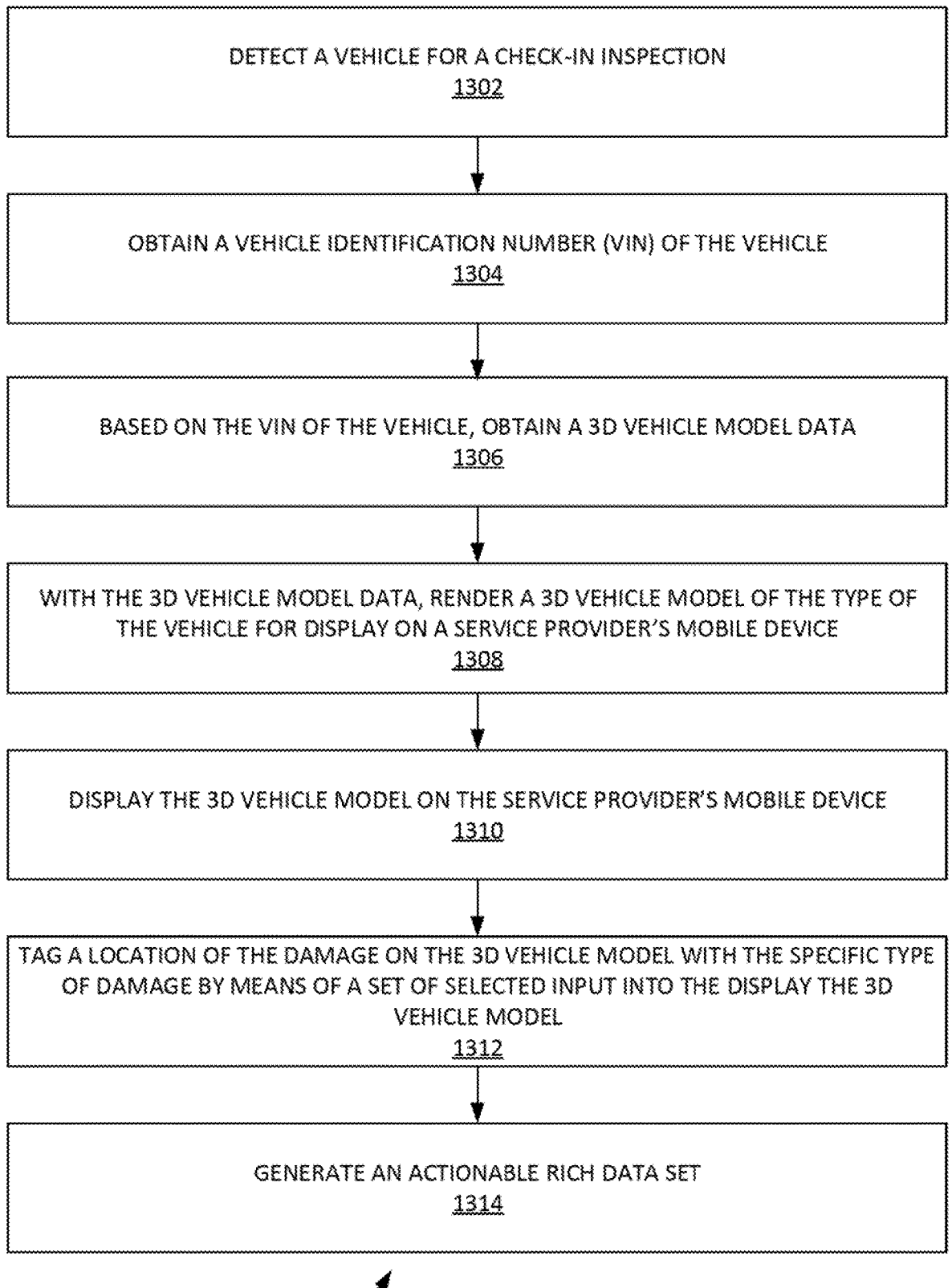
FIG. 13 illustrates an example process of generating actionable rich data with a 3D vehicle vehicle-modelling application, according to some embodiments.

FIG. 13 illustrates an example process 1300 of generating actionable rich data with a 3D vehicle vehicle-modelling application, according to some embodiments. In step 1302, process 300 can detect a vehicle for a check-in inspection. In step 1304, process 300 can obtain a vehicle identification number (VIN) of the vehicle, in step 1306, process 300 can, based on the VIN of the vehicle, obtain a 3D vehicle model data. The 3D vehicle model data can match a type of the vehicle. The 3D vehicle model data can be generated from a manufacturer's three-dimensional (3D) computer-aided design (CAD) model data of the type of the vehicle. In step 1308, process 300 can, with the 3D vehicle model data, render a 3D vehicle model of the type of the vehicle for display on a service provider's mobile device. In step 1310, process 300 can display the 3D vehicle model on the service provider's mobile device. The 3D vehicle model can receive user gestures indicating a specific type of damage and a location of the damage on the 3D vehicle model. In step 1312, process 300 can tag a location of the damage on the 3D vehicle model with the specific type of damage by means of a set of selected input into the display the 3D vehicle model. In step 1314, process 300 can generate an actionable rich data set. The rich data set can include the location of the damage on the 3D vehicle model and the specific type of damage.

CONCLUSION

Although the present embodiments have been described with reference to specific example embodiments, various modifications and changes can be made to these embodiments without departing from the broader spirit and scope of the various embodiments. For example, the various devices, modules, etc. described herein can be enabled and operated using hardware circuitry, firmware, software or any combination of hardware, firmware, and software (e.g., embodied in a machine-readable medium).

In addition, it will be appreciated that the various operations, processes, and methods disclosed herein can be embodied in a machine-readable medium and/or a machine accessible medium compatible with a data processing system (e.g., a computer system), and can be performed in any order (e.g., including using means for achieving the various operations). Accordingly, the specification and drawings are to be regarded in an illustrative rather than a restrictive sense, in some embodiments, the machine-readable medium can be a non-transitory form of machine-readable medium.

What is claimed is:

1. A computer-implemented method of a vehicle inspection check-in process for service comprising:
    obtaining, by a service provider's mobile device, a vehicle identification number (VIN) of a vehicle during a check-in process for service of the vehicle;
    obtaining, by the service provider's mobile device, a three-dimensional (3D) vehicle model data that matches a type of the vehicle based on the VIN of the vehicle;
    rendering, by the service provider's mobile device, a 3D vehicle model of the type of the vehicle using the 3D vehicle model data;
    displaying, by the service provider's mobile device, the rendered 3D vehicle model of the type of the vehicle;
    receiving user gestures on the 3D vehicle model after the display of the 3D vehicle model on the service provider's mobile device while the vehicle is at a dealership, the received user gestures indicating a specific type of damage on the vehicle and a location of damage on the 3D vehicle model that corresponds to a location of the damage on the vehicle;
    tagging, by the service provider's mobile device, the location of the damage on the 3D vehicle model with the specific type of damage based on the received user gestures;
    automatically generating, by the service provider's mobile device, a rich data set based on the location of the damage on the 3D vehicle model and the specific type of damage, the rich data set comprising the location of the damage on the 3D vehicle model, the specific type of damage, and a recommended service to repair the damage on the vehicle; and
    displaying, by service provider's mobile device, the rich data set to the service provider for the service of the vehicle, the rich data set including at least the recommended service to repair the damage on the vehicle.

2. The computer-implemented method of claim 1, wherein the recommended service includes a specific part number of a part of the vehicle to repair the damage on the vehicle and a cost for labor of the repair and the part.

3. The computer-implemented method of claim 2, wherein automatically generating the rich data set comprises:
    automatically determining the specific part number of the part of the vehicle based on the recommended service to repair the damage on the vehicle; and
    displaying the specific part number on the service provider's mobile device along with the recommended service to repair the damage on the vehicle.

4. The computer-implemented method of claim 3, further comprising:
    determining whether the part is in inventory stock or whether the part needs to be ordered during the check in process and a time that the part will be delivered if the part is not in the inventory stock; and
    receiving, by the service provider's mobile device, a purchase approval of the part from an owner of the vehicle during the check in process.

5. The computer-implemented method of claim 1, wherein the 3D vehicle model data is generated from a manufacturer's 3D computer-aided design model data corresponding to the type of the vehicle.

6. The computer-implemented method of claim 5, wherein the 3D vehicle model data includes a model year of the vehicle, a make of the vehicle, and a model name of the vehicle, and
wherein the rendered 3D vehicle model displayed by the service provider's mobile device includes the model year of the vehicle, the make of the vehicle, and the model name of the vehicle.

7. The computer-implemented method of claim 1, wherein the type of the vehicle comprises a sedan, a sports utility vehicle, or a truck.

8. The computer-implemented method of claim 1, further comprising:
capturing, by the service provider's mobile device, at least one of an image or a video with audio of the damage on the vehicle, wherein the captured image or the captured video of the damage on the vehicle is included in the rich data set that is displayed on the service provider's mobile device.

9. The computer-implemented method of claim 1, wherein obtaining the VIN comprises receiving the VIN through a passthrough on-board diagnostic device that is coupled to the vehicle or receiving a manual entry of the VIN into the service provider's mobile device.

10. The computer-implemented method of claim 1, wherein the 3D vehicle model displayed by the service provider's mobile device initially lacks any tagged locations of damage on the 3D vehicle model until the location of the damage is tagged on the 3D vehicle model with the specific type of damage based on the received user gestures.

11. A computer system of a service provider for a vehicle inspection check-in process for service comprising:
a processor;
a non-transitory computer-readable memory containing instructions when executed on the processor, causes the processor to perform operations including:
obtaining, by the computer system, a vehicle identification number (VIN) of a vehicle during a check-in process for service of the vehicle;
obtaining, by the computer system, a three-dimensional (3D) vehicle model data that matches a type of the vehicle based on the VIN of the vehicle;
rendering, by the computer system, a 3D vehicle model of the type of the vehicle using the 3D vehicle model data;
displaying, by the computer system, the rendered 3D vehicle model of the type of the vehicle;
receiving user gestures on the 3D vehicle model after the display of the 3D vehicle model on the by the computer system while the vehicle is at a dealership, the received user gestures indicating a specific type of damage on the vehicle and a location of damage on the 3D vehicle model that corresponds to a location of the damage on the vehicle;
tagging, by the computer system, the location of the damage on the 3D vehicle model with the specific type of damage based on the received user gestures;
automatically generating, by the computer system, a rich data set based on the location of the damage on the 3D vehicle model and the specific type of damage, the rich data set comprising the location of the damage on the 3D vehicle model, the specific type of damage, and a recommended service to repair the damage on the vehicle; and
displaying, by the computer system, the rich data set to the service provider for the service of the vehicle, the rich data set including at least the recommended service to repair the damage on the vehicle.

12. The computer system of claim 11, wherein the recommended service includes a specific part number of a part of the vehicle to repair the damage on the vehicle and a cost for labor of the repair and the part.

13. The computer system of claim 12, wherein automatically generating the rich data set comprises:
automatically determining the specific part number of the part of the vehicle based on the recommended service to repair the damage on the vehicle; and
displaying the specific part number on the service provider's mobile device along with the recommended service to repair the damage on the vehicle.

14. The computer system of claim 13, wherein the instructions when executed on the processor, causes the processor to perform further operations including:
determining whether the part is in inventory stock or whether the part needs to be ordered during the check in process and a time that the part will be delivered if the part is not in the inventory stock; and
receiving, by the computer system, a purchase approval of the part from an owner of the vehicle during the check in process.

15. The computer system of claim 11, wherein the 3D vehicle model data is generated from a manufacturer's 3D computer-aided design model data corresponding to the type of the vehicle.

16. The computer system of claim 15, wherein the 3D vehicle model data includes a model year of the vehicle, a make of the vehicle, and a model name of the vehicle, and
wherein the rendered 3D vehicle model displayed by the service provider's mobile device includes the model year of the vehicle, the make of the vehicle, and the model name of the vehicle.

17. The computer system of claim 11, wherein the instructions when executed on the processor, causes the processor to perform further operations including:
capturing, by the service provider's mobile device, at least one of an image or a video of the damage on the vehicle, wherein the captured image or the captured video of the damage on the vehicle is included in the rich data set that is displayed on the service provider's mobile device.

18. The computer system of claim 11, wherein obtaining the VIN comprises receiving the VIN through a passthrough on-board diagnostic device that is coupled to the vehicle or receiving a manual entry of the VIN into the service provider's mobile device.

19. The computer system of claim 11, wherein the 3D vehicle model displayed by the computer system initially lacks any tagged locations of damage on the 3D vehicle model until the location of the damage is tagged on the 3D vehicle model with the specific type of damage based on the received user gestures.

20. A non-transitory computer-readable storage medium storing executable code for a vehicle inspection check-in process for service, the code when executed by a processor causes the processor to perform steps comprising:
obtaining, by a service provider's mobile device, a vehicle identification number (VIN) of a vehicle during a check-in process for service of the vehicle;
obtaining, by the service provider's mobile device, a three-dimensional (3D) vehicle model data that matches a type of the vehicle based on the VIN of the vehicle;

rendering, by the service provider's mobile device, a 3D vehicle model of the type of the vehicle using the 3D vehicle model data;

displaying, by the service provider's mobile device, the rendered 3D vehicle model of the type of the vehicle;

receiving user gestures on the 3D vehicle model after the display of the 3D vehicle model on the service provider's mobile device while the vehicle is at a dealership, the received user gestures indicating a specific type of damage on the vehicle and a location of damage on the 3D vehicle model that corresponds to a location of the damage on the vehicle;

tagging, by the service provider's mobile device, the location of the damage on the 3D vehicle model with the specific type of damage based on the received user gestures;

automatically generating, by the service provider's mobile device, a rich data set based on the location of the damage on the 3D vehicle model and the specific type of damage, the rich data set comprising the location of the damage on the 3D vehicle model, the specific type of damage, and a recommended service to repair the damage on the vehicle; and displaying, by service provider's mobile device, the rich data set to the service provider for the service of the vehicle, the rich data set including at least the recommended service to repair the damage on the vehicle.

\* \* \* \* \*